United States Patent [19]

Benner

[11] Patent Number: 5,013,913
[45] Date of Patent: May 7, 1991

[54] METHOD OF ILLUMINATING AN OBJECT IN A TRANSMISSION ELECTRON MICROSCOPE

[75] Inventor: Gerd Benner, Aalen, Fed. Rep. of Germany

[73] Assignee: Carl-Zeiss-Stiftung, Heidenheim, Fed. Rep. of Germany

[21] Appl. No.: 384,273

[22] Filed: Jul. 24, 1989

[30] Foreign Application Priority Data

Jul. 23, 1988 [DE] Fed. Rep. of Germany ....... 3825103

[51] Int. Cl.$^5$ .............................................. H01J 29/46
[52] U.S. Cl. ..................................... 250/307; 250/311; 250/396 R
[58] Field of Search ........... 250/302, 396 R, 396 ML, 250/398, 311

[56] References Cited

U.S. PATENT DOCUMENTS

| | | | |
|---|---|---|---|
| 3,560,781 | 2/1971 | Riecke . | |
| 3,857,034 | 12/1974 | Hoppe | 250/396 R |
| 3,924,126 | 12/1975 | Anderson et al. | 250/311 |
| 4,044,255 | 8/1977 | Krisch et al. | 250/311 |
| 4,097,740 | 6/1978 | Müller et al. | 250/311 |
| 4,153,843 | 5/1979 | Pease | 250/396 R |
| 4,246,487 | 1/1981 | Anger et al. | 250/396 R |
| 4,283,627 | 8/1981 | Isakozawa et al. | 250/398 |
| 4,633,085 | 12/1986 | Tomita et al. | 250/11 |
| 4,812,652 | 3/1989 | Egle et al. | 250/311 |
| 4,851,674 | 7/1989 | Kobayashi | 250/311 |

FOREIGN PATENT DOCUMENTS

| | | |
|---|---|---|
| 0075712 | 4/1986 | European Pat. Off. . |
| 875555 | 5/1942 | Fed. Rep. of Germany . |
| 3047567 | 12/1980 | Fed. Rep. of Germany . |
| 1604898 | 12/1981 | United Kingdom . |

OTHER PUBLICATIONS

"Zeiss Information" pp. 4 and 5, MEM Nr. 4, Sep. 1985.

Primary Examiner—Jack I. Berman
Assistant Examiner—Kiet T. Nguyen
Attorney, Agent, or Firm—Walter Ottesen

[57] ABSTRACT

The invention is directed to a method of illuminating an object in a transmission electron microscope. For illuminating the object, two condenser lenses are used such that they image an image of the electron source with different demagnifications. This crossover is imaged in the focal plane of a single-field condenser objective lens by means of a third condenser lens 14 for TEM-operation whereby the illumination aperture can be adjusted with respect to its magnitude. The electron beam is shaped ahead of the single-field condenser objective lens by two diaphragms arranged in different planes and by means of at least one deflection system such that the magnitude of the illumination field on the object is only slightly larger than the region magnified by the electron microscope. The magnitude of the illumination field and the illuminating aperture can be adjusted independently of each other.

15 Claims, 6 Drawing Sheets

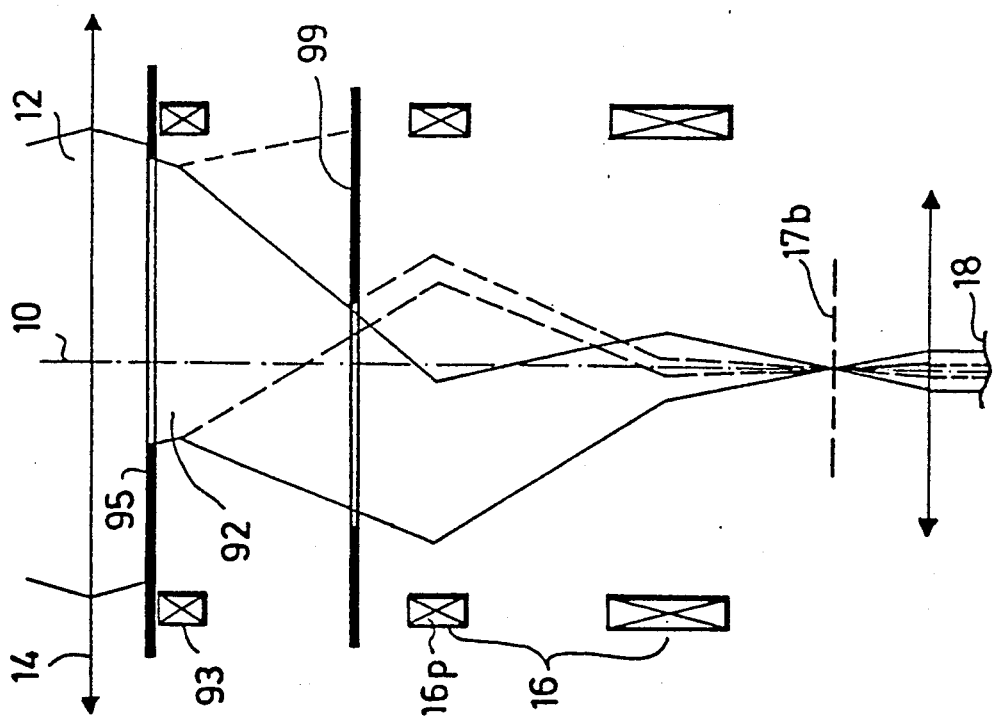
FIG. 9a
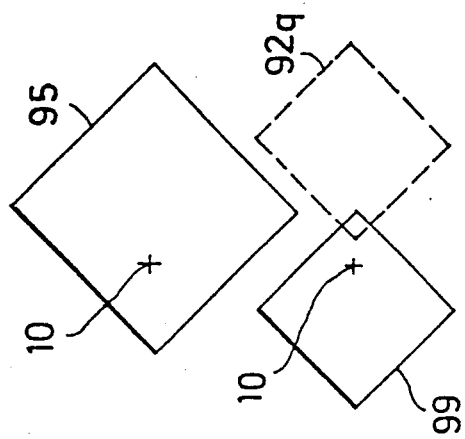
FIG. 9b
FIG. 9c
FIG. 9d 5,013,913

METHOD OF ILLUMINATING AN OBJECT IN A TRANSMISSION ELECTRON MICROSCOPE

FIELD OF THE INVENTION

The invention relates to a method for illuminating an object in a transmission electron microscope having an electron source and a plurality of condenser lenses conjointly defining an electron beam axis. The microscope further includes a single-field condenser objective lens and a deflection system arranged ahead of the single-field condenser objective lens.

BACKGROUND OF THE INVENTION

Modern electron microscopes are mostly equipped with a so-called single-field condenser objective lens (SFCO-lens) of Riecke and Ruska as described, for example, in German Patent 875,555. Here, for a suitable incident beam, the symmetrical positioning of the object in the gap center of the pole pieces makes possible the high resolution transmission operation (TEM-operation) and the generation of very small electron probes for the scanning transmission operation (STEM-operation) and the micro diffraction. For TEM-operation, the last condenser lens images the electron source into the front focal point of the SFCO prefield lens and thereby effects an axially parallel illumination of the object. The magnitude of the illumination field of the object is then determined by the diameter of the so-called condenser diaphragm (illumination diaphragm). For STEM-operation, the electron source is imaged by the last condenser lens into the imaging plane of the SFCO prefield lens which images the electron source demagnified into the object.

However, this TEM illumination has the disadvantage that the imaging of the electron source into the front focal point of the SFCO prefield lens must be strictly maintained; otherwise, the short focal length prefield of the SFCO lens effects an extremely slanted illumination of the off-axis object area. The last condenser lens can therefore not be utilized to control the magnitude of the illumination field from the object and its aperture (brightness).

German published patent application 2,882,242 discloses the installation of an auxiliary lens close ahead of the SFCO lens. This auxiliary lens and the SFCO prefield lens conjointly define a telefocal lens system. With this auxiliary lens, an illumination of the object is obtained which corresponds to the known transmission electron microscopes and therefore has the disadvantage that the illuminating aperture and the illumination field cannot be adjusted independently of each other. The auxiliary lens must be switched off or its action minimized for generating small probes in STEM operation whereby the adjustment of the SFCO lens can change.

An independent adjustment of the illuminating aperture and the illumination field of the object is discussed in German Patent 1,614,123. Here, first a greatly reduced image of the electron source (crossover) is generated by a first condenser lens having a short focal length and this image is imaged into the focal plane of the SFCO prefield lens by a second condenser lens having a long focal length. Behind the second condenser lens, the illumination field diaphragm is disposed which is sharply imaged into the object plane by the SFCO prefield lens thereby determining the magnitude of the illuminated object area. The illuminating aperture is determined by the magnitude of the crossover in the focal plane of the SFCO prefield lens and is changed by the degree of demagnification of the first condenser lens which, for this purpose, has a selectively insertable pole piece system effecting different image distances.

A disadvantage of this solution is that the selectively insertable pole piece systems are mechanically very complex and they require a follow-up adjustment and permit only a slight variation of the illumination aperture in few stages. No information is provided for changing the illumination field diaphragm so that only the known exchanging devices can be considered with the disadvantage of the necessary follow-up adjustment which for routine work by an operator is most annoying and which can hardly be asked of such an operator because of the location of the diaphragms.

An optimal illumination of the object in a transmission electron microscope must fulfill the following requirements:

(a) the illumination aperture (aperture angle of the illuminating beam cone) must be variable in order to be able to adapt the coherence of the illumination, the image brightness and the contrast to the particular object;

(b) the magnitude of the illuminated object area (illumination field) can only be slightly larger than the imaged object area in order to prevent unnecessary damage to the object and stray electrons which reduce contrast;

(c) the adjustment of the illuminating aperture and the magnitude of the illumination field must be independent of each other;

(d) the illumination beam solid angle must be incident on every point of the object as perpendicularly as possible in order to prevent image distortions through inclined illumination in the off-axis region; and, (e) the illumination field must be uniformly illuminated and without structure.

In the area of light microscopy, these requirements are fulfilled in an illuminating system by the so-called Köhler illumination. This principle has been applied in electron microscopy in only a few cases for individual magnification adjustments notwithstanding its clear advantages. This situation is present because for electron optical systems, there are no diaphragms having a variable diameter and having the required edge definition and for this reason a continuous exchange of the diaphragms would be required. This exchange is however unacceptable because of the position of the diaphragms and the time consumed for exchanging the diaphragms and the required follow-up adjustments after each exchange in routine operation.

SUMMARY OF THE INVENTION

It is an object of the invention to provide an illuminating method for a transmission electron microscope which corresponds to the Köhler illumination in a large magnification range with simple manipulation. Furthermore, the illuminating method should make possible the generation of electron beam probes having a very small diameter for microanalysis and the STEM-operation.

The essential features of the invention are delineated below.

(a) At least two of the condenser lenses are utilized such that they image the electron source with different predeterminable demagnifications. For TEM-operation, the illuminating aperture is thereby adjusted and in STEM-operation, the magnitude of the scanning electron beam on the specimen is selected.

(b) In TEM-operation, the electron beam is shaped by at least two diaphragms arranged in different planes and is influenced by at least one deflecting system. In this way, the axial position of the illumination field as well as the perpendicular illumination beam are maintained. The magnitude of the illumination field on the object is adapted to the magnification of the object by the electron microscope with the illumination field being only somewhat larger than that region of the object which is enlarged by the electron microscope onto one of the following: a fluorescent screen, a photoplate or an electronic image recording system.

(c) In an especially simple arrangement (FIG. 3), the only deflection system used is the deflection system which is anyway present ahead of the SFCO lens, and which is known for the centering of the electron beam ahead of the entrance into the SFCO lens and for deflecting or scanning of the electron beam in STEM-operation and for microanalysis. In other advantageous embodiments (FIGS. 4 to 8), an additional deflection system is utilized by means of which the electron beam is deflected out of the optical axis, for example, in different directions, and thereafter shaped by one of many diaphragms of different size. The deflection system ahead of the SFCO lens functions in these cases to deflect the shaped electron beam back again into the optical axis. In further advantageous embodiments (FIGS. 9 to 11), the electron beam is likewise deflected out of the optical axis by means of an ancillary deflection system and can be variably shaped by two diaphragms arranged in different planes on opposite sides corresponding to the strength of the deflection. Thereafter, the electron beam is deflected back again into the optical axis by the deflection system ahead of the SFCO lens.

Changes of the cross section of an electron beam by deflection out of the optical axis and the shaping by means of diaphragms are known; however, they are not known in combination with a SFCO lens. In contrast to the invention, a substantially smaller variation range for the magnitude of the illumination field (approximately 1 $\mu$m instead of 1 to at least 100 $\mu$m) is obtained with the known arrangements. Because of the required edge definition of less than 0.1 $\mu$m, the beam cross section for lithographic devices is formed just under the electron gun and is then imaged on the substrate greatly demagnified. In lithographic devices, the direction of the beam impinging on the substrate must not be perpendicular and does not have to be dependent on the magnitude of the illumination field. Therefore, there is no return deflection of the shaped electron beam into the optical axis. Finally, for lithographic devices, the aperture angle of the beam impinging on the substrate must not be adjusted variably; instead, the required exposure dosage for the generation of microstructures is adjusted via the exposure time.

An electron optical system for generating a shaped beam with a variable cross section for producing microstructures is disclosed in European patent publication 0,075,712. In this electron optical system, the electron beam shaped by the first slit aperture is deflected with the aid of a deflection system and displaced on a second slit diaphragm so that the electron beam has a rectangularly-shaped cross section with the desired dimensions behind the second slit diaphragm. Only the magnitude of the illumination field is changed on the semiconductor. The aperture of the electron beam cannot be varied.

Published International Patent Application WO80/02771 discloses an electron optical system wherein the aperture of an electron beam is changed by deflecting the electron beam out of the optical axis by means of a first deflection system and shaping the electron beam by means of one of several diaphragms arranged in a plane and deflecting the electron beam back into the optical axis by means of a second deflection system. In this case, only the aperture of the electron beam is changed.

BRIEF DESCRIPTION OF THE DRAWINGS

The invention will now be described with reference to the drawings wherein:

FIGS. 9 to 11 show arrangements for shaping the electron beam on mutually opposite sides by means of two diaphragms arranged in different planes; and, FIG. 12 is a block diagram for the automatic operation of an electron microscope having the optimal magnitude of the illumination field of the object.

DESCRIPTION OF THE PREFERRED EMBODIMENTS OF THE INVENTION

Figure 1:
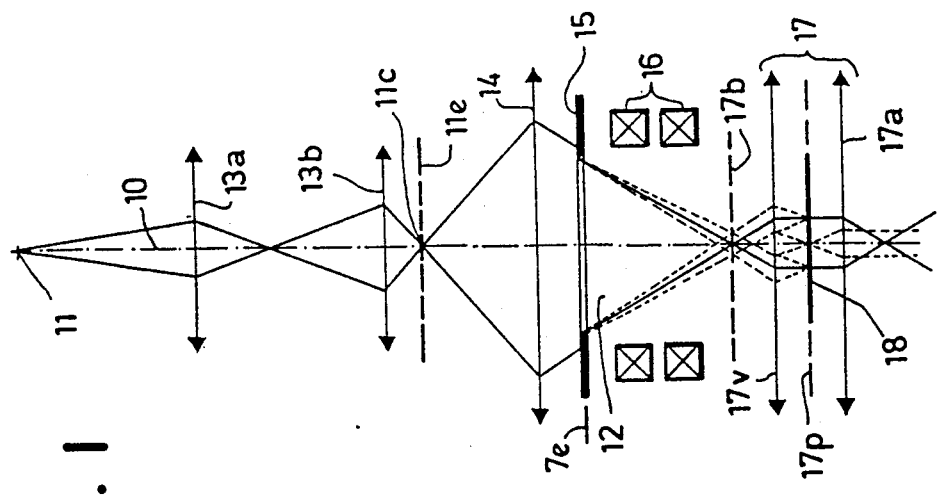
FIG. 1 is a schematic showing the illumination ray path of an electron microscope in TEM-operation.
Figure 5:
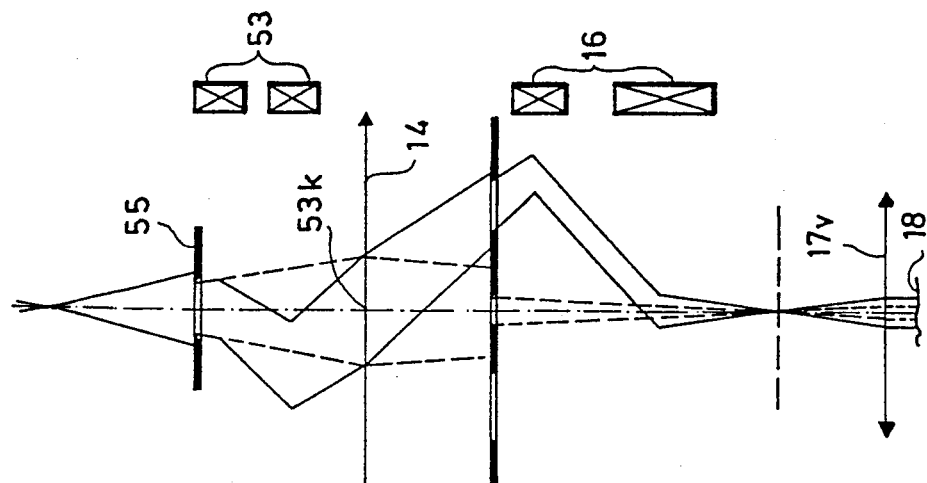
FIGS. 4 to 8 show arrangements for selecting one of several diaphragms as an illumination field diaphragm with an additional deflection system.

FIG. 1 shows the illuminating ray path for TEM-operation. Reference numeral 11 indicates the electron beam source or, more precisely expressed, the smallest beam cross section for the emitting cathode surface. This crossover is imaged with demagnification by the condensers (13a, 13b and 14) which lie on the common optical axis 10. The condensers (13a, 13b) are each so excited that an image 11c of the crossover plane 11e is generated in the plane 11e and has a magnitude which is dependent upon the respective excitation of the condensers (13a, 13b). The image 11c of the crossover 11, which is likewise designated only as a crossover, is imaged in the focal plane 17b of the SFCO prefield lens 17v by means of the condenser 14 during TEM-operation. The object 18 in the object plane 17p is therefore illuminated with rays parallel to the optical axis 10. The illuminating aperture is thereby determined by the magnitude of the crossover image in the focal plane 17b and the focal length of the SFCO prefield lens 17v and can therefore be varied in a wide range by different excitation of the condenser lenses (13a, 13b).

An illumination field diaphragm 15 is so arranged between the last condenser lens 14 and the SFCO lens 17 that it is at least imaged with approximate sharpness in the object plane 17p by the SFCO prefield lens 17v. The magnitude of the illuminated area is therefore determined by the diameter of the illumination field diaphragm and its demagnification by means of the SFCO prefield lens 17v. The illumination field diaphragm 15 is often also referred to as a condenser diaphragm or illumination diaphragm. For the ray path shown in FIG. 1, the dotted beam, which determines the magnitude of the illuminating aperture, has its narrowest cross section in the illumination field diaphragm 15 so that a change of the illumination field on the object 18 by means of the illumination field diaphragm 15 has no influence on the illuminating aperture. Furthermore, the magnitude of the illumination field is independent of the magnitude of the crossover image in the focal plane 17b so that the illumination field and illuminating aperture are completely independent of each other.

The SFCO lens 17 comprises the SFCO prefield lens 17v and the SFCO imaging lens 17a. A deflection system 16 is mounted ahead of the SFCO lens 17 and corrects small deviations of the electron beam 12 with respect to the axis of the SFCO lens 17. This known deflection system is referred to as the "deflection system 16 ahead of the SFCO lens" to distinguish the same from a deflection system which will be mentioned later.

Figure 2:
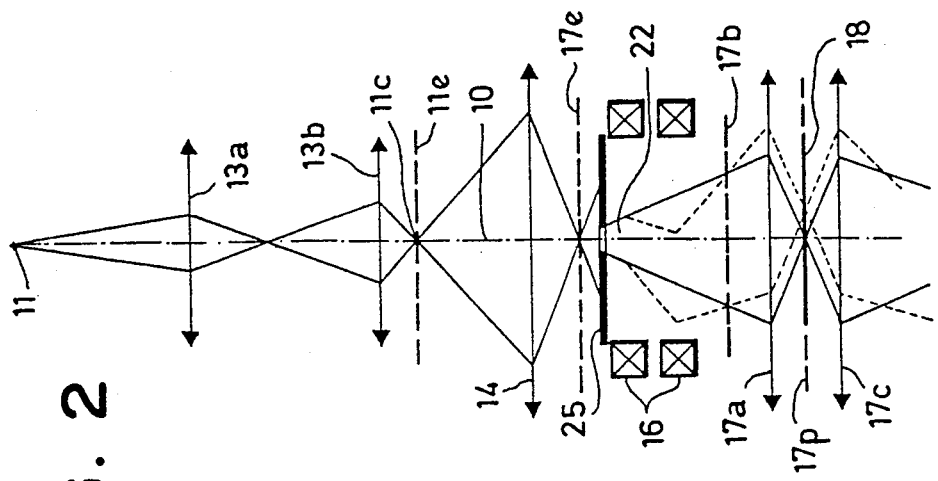
FIG. 2 shows the illumination ray path of the same electron microscope in STEM-operation.

FIG. 2 shows the ray path for STEM-operation or for micro diffraction. All lenses, the deflection system 16 ahead of the SFCO lens and the object 18 in the object plane 17p are in the same position as for TEM-operation in FIG. 1 and therefore have the same reference numerals in FIG. 2.

In contrast to FIG. 1, the condenser lens 14 images the crossover 11e in the entrance image plane 17e of the SFCO prefield lens 17v in STEM-operation or for micro diffraction so that a greatly demagnified image of the electron source 11 is produced on the object 18. This demagnified image is scanned by the deflection system 16 ahead of the SFCO lens in the object plane 17p as shown by the broken lines for a second point on the object 18. The aperture of the electron beam 22 scanning the object 18 is limited by a diaphragm 25 above or below the plane 17e. This diaphragm can also be mounted in the plane 17b if this space is not occupied by detectors during SEM-operation or the detection is obstructed by secondary electrons or X-rays. The magnitude of the scanning electron beam on the specimen 18 can be varied within a wide range by different excitation of the two condenser lenses (13a and 13b).

A zoom of this kind for SEM-operation is disclosed in the publication "Zeiss-Information" MEM No. 4, page 4, September 1985 by D. Kurz et al. It is used in the instant embodiment also for TEM-operation to change the illuminating aperture. The same condenser arrangement can be used for TEM-operation and STEM-operation if the demagnification of the last condenser lens 14 in TEM-operation is approximately four times less than in STEM-operation. For this reason, the last condenser 14 effects a 1.3× magnification in TEM-operation and a 3× demagnification in STEM-operation. For the present problem, the following dimensions are, for example, advantageous:

focal length of condenser lens 13a: 3.5 to 45 mm
focal length of condenser lens 13b: 3.5 to 13.0 mm
distance of crossover 11 to condenser lens 13a: 130 mm
distance of condenser lens 13a to condenser lens 13b: 75 mm For an image distance (distance of condenser lens 13b to image plane 11e) of 16 mm a demagnification range is thereby obtained for the image of the crossover of 0.5 to 160. For image distances of 8 and 4 mm, demagnification ranges of 1.6 to 320 and 20 to 630 result.

For TEM-operation, the aperture 15 of FIG. 1 must have very different diameters so that only an area is illuminated in each instance for a large magnification range of the electron microscope with this area being slightly larger than the area imaged on the final image screen or other image recording systems.

Embodiments of the method of the invention are shown in FIGS. 3 to 9 with which an exchange of diaphragms suitable also for routine operation can be made or suitable diaphragm changes can be carried out. All of the embodiments described can be automated and be coupled to the magnification adjustment of the electron microscope.

Figure 3:
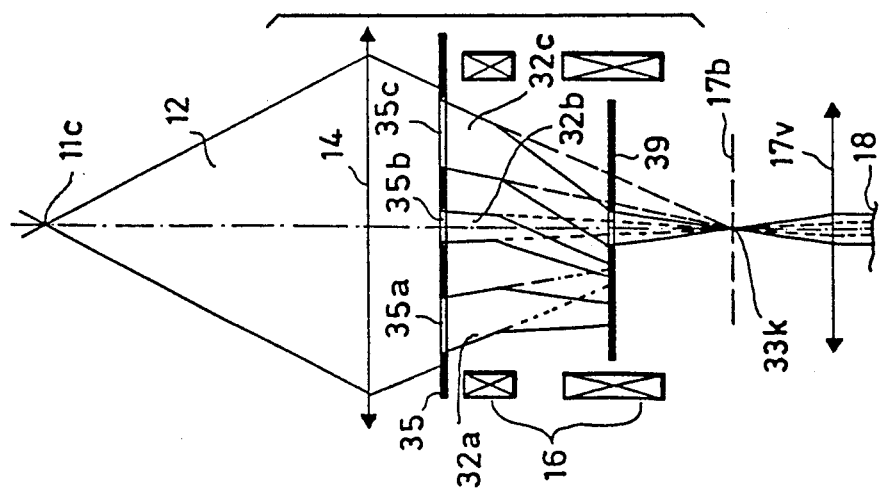
FIG. 3 is an arrangement for selecting one of several diaphragms as an illumination field diaphragm without an additional deflection system.

FIG. 3 shows an especially simple arrangement for realizing several diaphragms having different diameters and thereby having different illuminating fields on the object 18. Reference numeral 11c again identifies the crossover ahead of the last condenser lens 14. The electron beam 32 focussed by means of the condenser lens 14 in the front focal plane 17b of the SFCO lens 17v illuminates a multiple diaphragm 35 over a large area. The multiple diaphragm 35 comprises diaphragms (35a, 35b, 35c) of different sizes. The component beams (32a, 32b, 32c) passing through these diaphragms impinge upon an axially mounted selector diaphragm 39 by means of which only one of the component beams is permitted to pass in correspondence to the excitation of the deflection system 16 ahead of the SFCO lens. This is shown in FIG. 3 with solid lines for the component beam 32c which is permitted to pass through the largest diaphragm 35c.

As in the embodiments which follow, the smallest diaphragm 35b is preferably axial and the remaining diaphragms (35a, 35c) are arranged in a ring-shaped manner around the smallest diaphragm 35b. The broken lines apply to deflection system 16 lies in the front focal plane 17b of the SFCO lens 17v. With the aid of the selector diaphragm 39 and the deflection system 16, the condition is obtained that only the desired diaphragm is imaged axially on the object 18.

Figure 4:
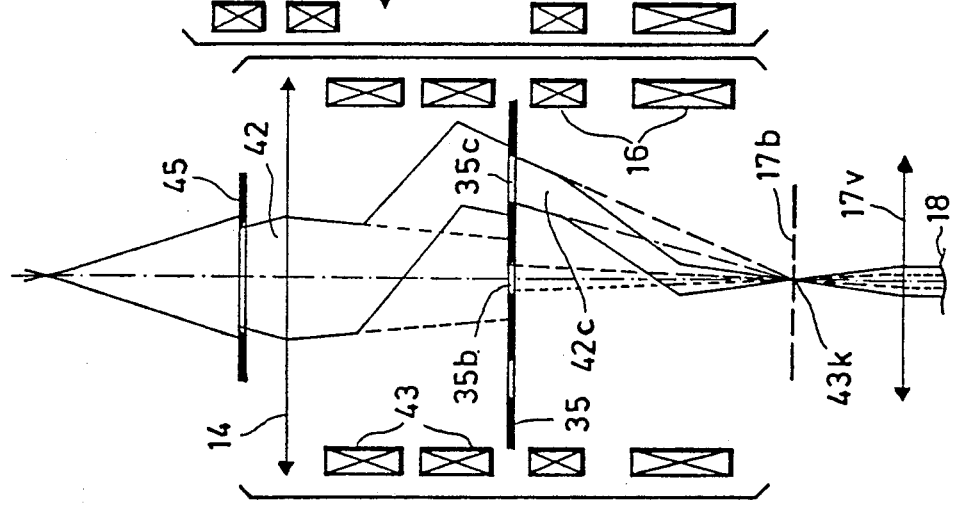

FIG. 4 shows an arrangement wherein the electron beam 42 limited by a limiting diaphragm 45 is deflected onto the desired diaphragm of the multiple diaphragm 35 by means of an additional deflection system 43. The ray path for the particular excitation condition of the deflection systems 43 and 16 wherein the largest diaphragm 35c is effective is again shown with solid lines; and, for the case wherein the smallest aperture 35b is effective, the ray path is again shown with broken lines. The additional deflection system 33 comprises a double deflection system having a pivot point 43k which preferably lies in the focal plane 17b of the SFCO lens 17v. In this case, the return deflection of the component beam 42c is effected by the deflection system 16 ahead of the SFCO lens in the usual manner of operation of this deflection system.

The arrangement shown in FIG. 4 requires a relatively large amount of space so that the deflection angles in the additional deflection system 43 can be held sufficiently small. The arrangement shown in FIG. 5 does not require additional space because the additional deflection system 53 is mounted ahead of the last condenser lens 14. The pivot point 53k of the double deflecting system 53 lies in the approximately constant principal plane of the last condenser lens 14 so that this lens can be operated with a variable focal length.

Figure 6:
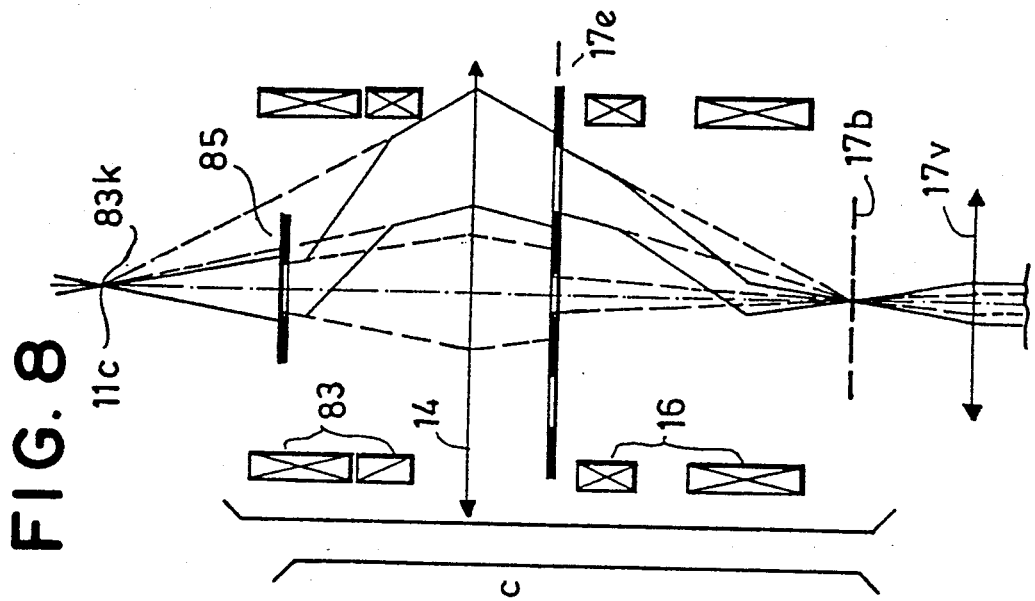
Figure 7:
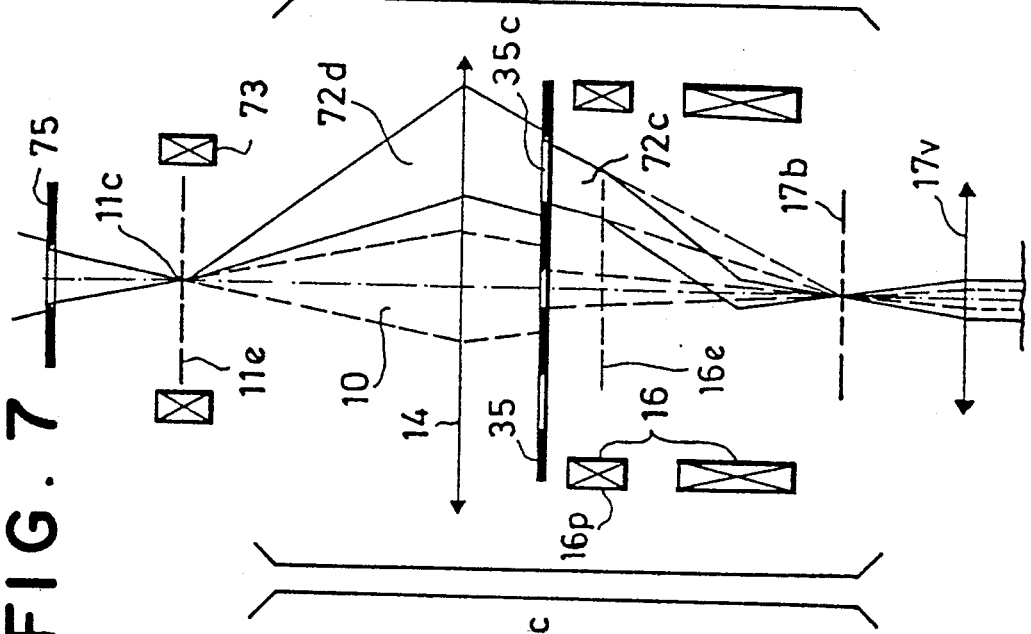
Figure 8:
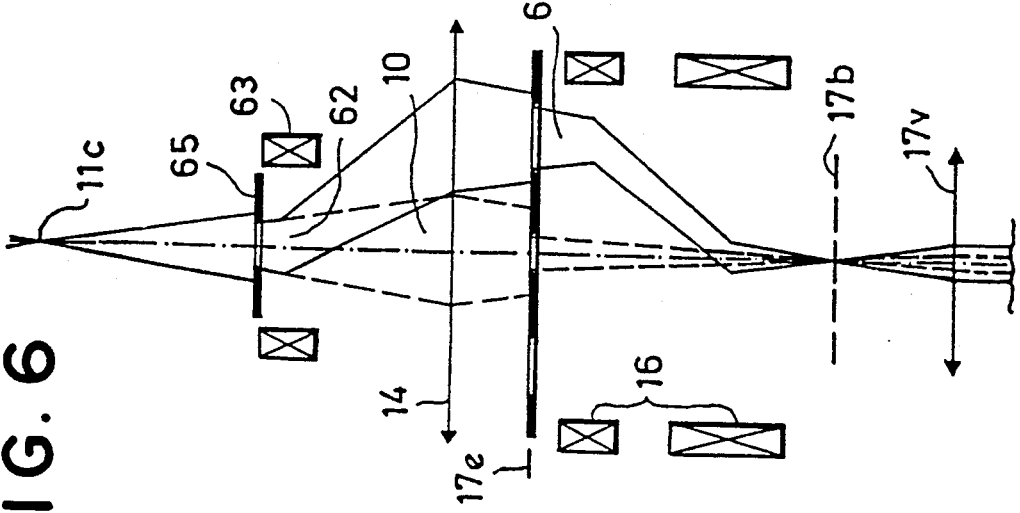

In the embodiments shown in FIGS. 6 to 8, the additional deflection system likewise is disposed ahead of the last condenser lens 14 which now, however, has constant excitation and, in addition, exercises a return deflection action on the out-deflected electron beam.

In FIG. 6, the additional deflection element 63 is mounted in the front focal plane of the last condenser lens 14. For this reason, the electron beam 62 limited by the limiting diaphragm 65 is displaced parallelly by means of the deflection element 63 and the last condenser lens 14. After passing the desired diaphragm, the electron beam 62c is deflected back by the deflection system 16 ahead of the SFCO lens to the optical axis 10. In this arrangement, as in the arrangement shown in FIG. 7, only one additional deflection element is required.

In FIG. 7, the additional deflection element 73 is arranged in the crossover plane 11e (image plane of the condenser zoom) ahead of the last condenser lens 14 and the limiting diaphragm 75 lies ahead of this image plane. The deflected beam 72d is focussed into the focal plane 17b of the SFCO lens 17v by the last condenser lens 14. The deflection system 16 ahead of the SFCO lens again deflects the electron beam 72c back into the optical axis 10 with the electron beam 72c being shaped, for example, by the diaphragm 35c.

The illumination of very large object areas is possible with the arrangement shown in FIG. 7. If the crossover 11c is positioned closer to the limiting diaphragm 75 for lower magnifications in the transmission operation, then the aperture acts less illumination field limiting so that very large object areas can be illuminated when the multiple aperture diaphragm 35 is taken out of the ray path. The magnitude of the illumination field is dependent upon the diameter of the illuminating diaphragm 75 and its spacing from the crossover plane 11e. A change of the distance of the crossover plane 11e from the limiting plane 75 influences only the magnitude of the illumination field. The illuminating aperture can be varied without changing the magnitude of the illumination field by changing the crossover demagnification via the condenser lenses (13a, 13b) when the crossover plane 11e of the condenser zoom is constant. With a limiting aperture 75 of 200 to 250 μm in the principal plane of the condenser lens 13b, there are obtained, for example, for image distances of the condenser zoom of 4, 8 and 16 mm, illumination fields on the object of approximately 140, 70 and 35 μm, respectively, which allows corresponding minimal microscope magnifications of 1,000×, 2,000× and 4,000×X. The image width of the condenser zoom corresponds to the distance of the crossover plane 11e to the condenser lens 13b.

An automated diaphragm exchange is also possible for microscope magnifications of equal to or less than 1,000X. For this small magnification or so-called low magnification mode, the SFCO lens including the SFCO prefield lens 17v are operated so that they have a long focal length as disclosed in German Patent 2,742,264. For this case, the last condenser lens 14 images the crossover 11c in the center plane 16e of the upper deflection system 16p of the deflection system 16 ahead of the SFCO-lens. This imaging of the crossover 11c is produced with variable magnification by the condenser lenses (13a, 13b). The SFCO prefield lens 17v is excited so that its focal point likewise lies in this plane 16e. In this way, the object 18 is illuminated axially parallel and the illumination aperture is determined by the magnitude of the crossover in the center plane 16e. The multiple diaphragm 35 is in this case arranged as close as possible to the principle plane of the last condenser lens 14 and enables illumination fields of different magnitudes on the object by means of corresponding deflections of the electron beam with the aid of the deflection system 73 and the return deflections by means of the upper deflection system 16p.

A ray path similar to that shown in FIG. 7 results when, as illustrated in FIG. 8, the additional deflection system in the form of a double deflection system 83 is mounted after the crossover 11c ahead of the last condenser lens 14. The virtual pivot point 83k of this double deflection system lies in the crossover 11c. The limiting diaphragm 85 can lie ahead of or behind the crossover 11c.

Figure 10:
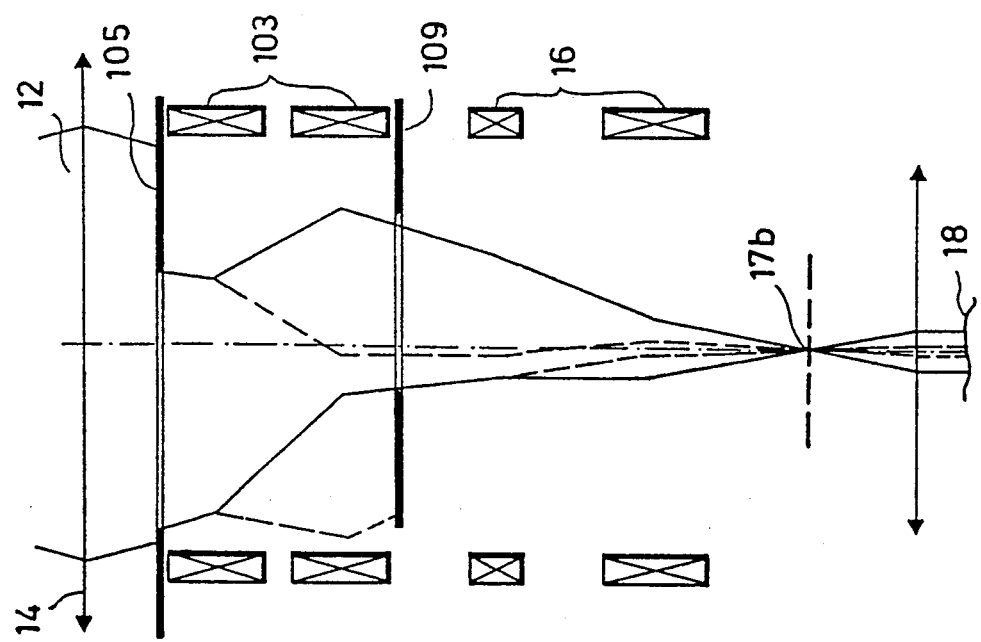
Figure 11:
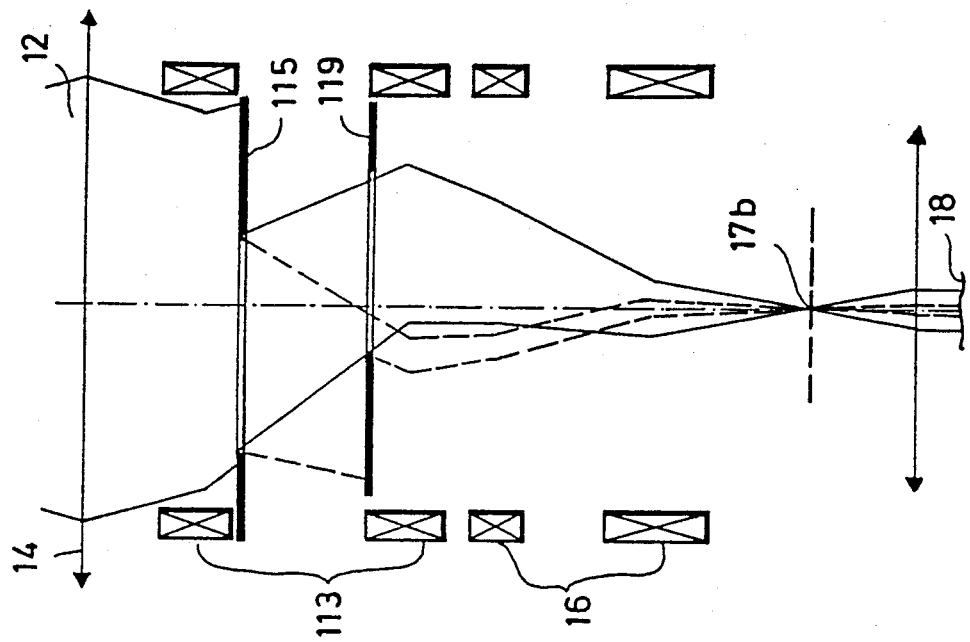

Embodiments are shown in FIGS. 9 to 11 wherein the electron beam is deflected out of the optical axis in one direction with different strength by means of an additional deflection system and its cross section is more or less shaped by two apertures arranged off axis in different planes on sides lying opposite each other.

FIG. 9 shows an embodiment with only one additional deflection system 93 which is mounted after the last condenser lens 14. The electron beam 12 is shaped ahead of this deflection system by diaphragm 95 mounted off axis and whose cross section and position to the optical axis is shown in FIG. 9b. The further course of the shaped electron beam 92 is shown with solid lines for a large illumination field and with broken lines for a small illumination field. The beam cross section 92 formed by the first off-axis aperture 95 is deflected by the additional deflection system 93 such that it variably illuminates a second off-axis diaphragm 99 whose cross section and position to the optical axis is shown in FIG. 9c. In the case of the solid lines, the deflection occurs such that the electron beam 92 is not shaped by the diaphragm 99. In the case of the broken lines, the cross section 92q of the electron beam in the plane of the diaphragm 99 is displaced such that only a small portion passes through the diaphragm. FIG. 9d shows the cross sections of the electron beam after this beam has been again deflected back into the optical axis by means of the deflection system 16 ahead of the SFCO lens.

In the embodiment described, another deflection mode of the deflection system 16 ahead of the SFCO lens is required than with the conventional mode of operation. Furthermore, and in contrast to normal operation, large deflecting angles and large off axis operation occur with the first deflection element 16p. This disadvantage is prevented by means of the double deflection systems (103, 113) used in FIGS. 10 and 11. The pivot point of these double deflection systems lies in the focal plane 17b of the SFCO prefield lens. In the embodiment shown in FIG. 10, the off-axis diaphragms 105 and 109 are arranged forward and rearward of the double deflection system 103. In FIG. 11, the off-axis diaphragms 115 and 119 are within the double deflection system 113. The last embodiment affords the advantage that the off-axis diaphragms 115 and 119 can be mounted as a mechanical unit. When several such units are arranged on a common diaphragm carrier, then, according to a further embodiment of the invention, the particularly suitable diaphragm system can be pivoted into position for different magnification ranges so that small deflection angles of the double deflection system 113 result.

In all embodiments, it is advantageous to image the image 11c of the electron source 11 with the zoom from the condensers (13a, 13b) into a fixed predetermined plane 11e. However, this is not necessary. What is decisive is only that the last crossover of the common condenser system lies in the focal plane 17b for TEM-operation and, for STEM-operation, that it always lies in the entrance image plane 17e of the SFCO prefield lens 17v.

For small magnifications, it can be advantageous that the image 11c of the electron beam 11 is transferred with the zoom from the condensers (13a, 13b) into another plane as was explained with reference to FIG. 7. For a very large magnification range and large aperture range of the electron microscope, it can be advantageous to provide several planes as image planes for the condenser zoom as shown above for the dimensioning of the zoom and the embodiment of FIG. 7.

Figure 12:
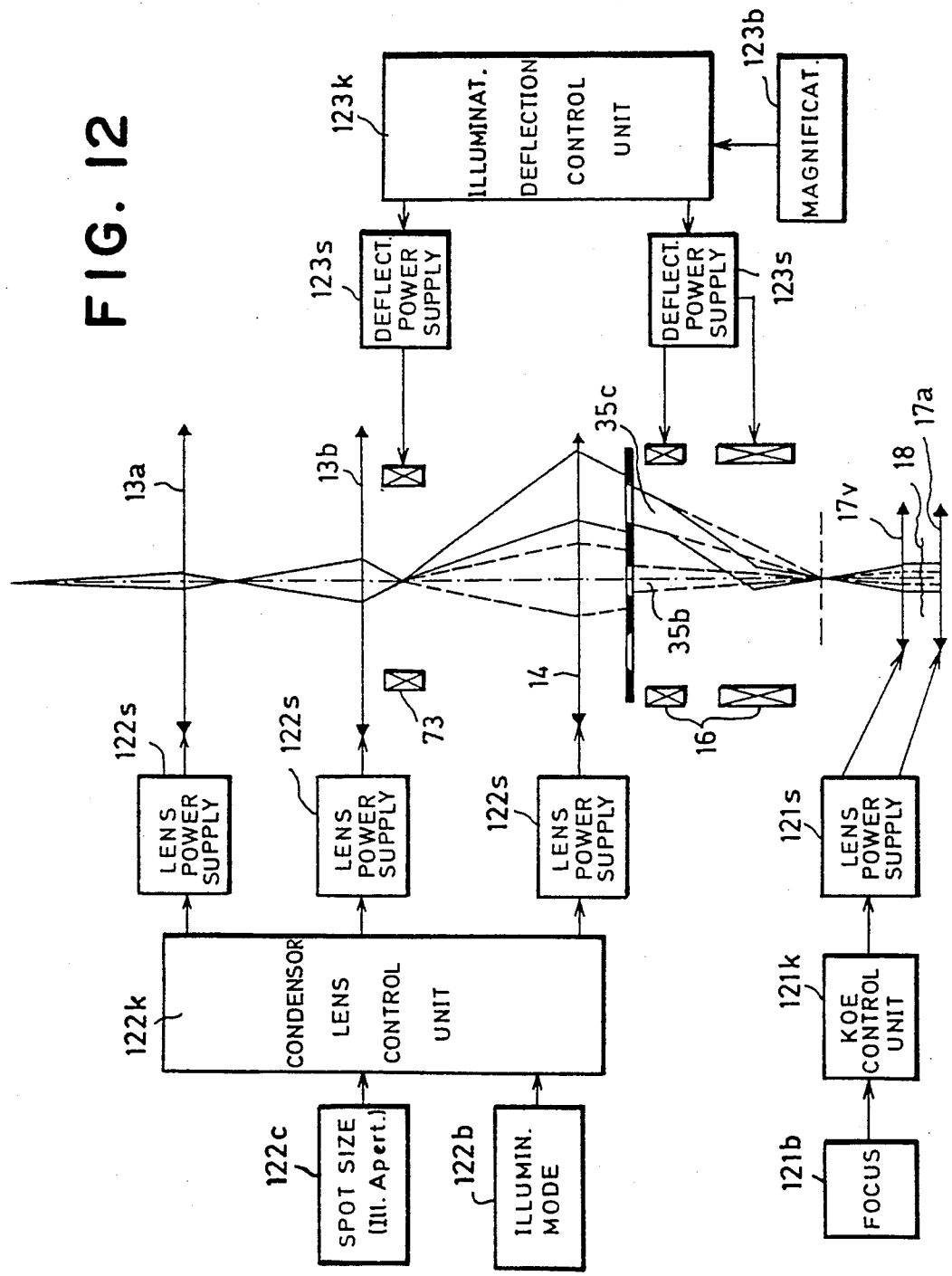

FIG. 12 shows a block diagram for the current supply and for the operating elements of the illuminating system for the embodiment for the diaphragm selection shown in FIG. 7. Reference numeral 121b identifies the operating element for the focus adjustment which is connected via the control unit 121k for the SFCO lens to the current supply 121s for the SFCO prefield lens 17v and the SFCO imaging lens 17a.

The current supply 122s s of the three condenser lenses (13a, 13b and 14) are connected with a control unit 122k to which, on the one hand, the operating element 122b is connected for selecting the TEM-operation or STEM-operation and, on the other hand, the operating element 122c is connected for controlling the illuminating aperture for TEM-operation and for controlling the probe size for STEM-operation.

The deflection systems 16 and 73 are connected to current supplies 123s which are connected to a control unit 123k which, in turn, is connected with the operating element 123b for magnification. The operating element 123b is furthermore connected via a control unit (not shown) with current supply units (not shown) for the imaging lenses of the electron microscope so that with the adjustment of the magnification of the electron microscope that illuminating diaphragm (35b, 35c) is automatically selected which illuminates an area of object 18 which is only slightly greater than the region enlarged by the electron microscope and imaged on a fluorescent screen or a detector.

The block diagram of FIG. 12 applies to the embodiments shown in FIGS. 3 to 6 and 8 to 11 with only minor changes.

It is understood that the foregoing description is that of the preferred embodiments of the invention and that various changes and modifications may be made thereto without departing from the spirit and scope of the invention as defined in the appended claims.

What is claimed is:

1. Method of illuminating an object in a transmission electron microscope including an electron source and a plurality of condenser lenses for generating an electron beam travelling along an optical axis, a single-field condenser objective lens (SFCO lens) mounted on said optical axis downstream of said plurality of condenser lenses and a deflection system arranged on said optical axis upstream of said SFCO lens, the method comprising the steps of:
   exciting at least two of said condenser lenses to image said electron source with a varying, pregiven demagnification;
   magnifying the object to a predetermined magnification with the aid of imaging stages disposed downstream of said plurality of condenser lenses;
   shaping the electron beam to a different size by means of at least two diaphragm units arranged in respective planes upstream of said SFCO lenses in dependence upon said magnification;
   deflecting at least a component of the shaped beam back into the optical axis; and,
   said electron beam being shaped by said diaphragms in dependence upon said magnification so as to cause only one area of the object to be illuminated which is not significantly larger than the imaged area.

2. The method of claim 1, wherein the condenser lens of said plurality of condenser lenses farthest downstream of said plurality of condenser lenses is excited so that the crossover of said electron source is imaged into the focal plane during TEM-operation and is imaged into the entrance image plane of said SFCO lens during STEM-operation.

3. The method of claim 1, wherein one of said diaphragm units defines a plurality of different sized diaphragms arranged in a single plane and the other one of said diaphragm units is a selector diaphragm arranged downstream of said one diaphragm unit; and, wherein the method comprises the steps of:
   illuminating said plurality of diaphragms to produce a plurality of component electron beams passing therethrough; and,
   deflecting only one of said component beams with said deflecting system through said selector diaphragm in dependence upon said magnification and onto said object.

4. The method of claim 1, wherein one of said diaphragm units defines a plurality of different sized diaphragms arranged in a single plane downstream of a diaphragm for limiting the electron beam; and, wherein the method comprises the steps of:
   deflecting the limited electron beam with an ancillary deflection system out of said optical axis with the beam being deflected with varying strength and/or direction in dependence upon the magnification; and,
   shaping the deflected limited electron beam with one of the diaphragms of said other diaphragm unit.

5. The method of claim 1, wherein one of said diaphragm units defines a first diaphragm off axis to one side of said optical axis and the other one of said diaphragm units defines a second diaphragm off axis to an other side of said optical axis opposite said one side; and, wherein the method comprises the steps of:
   deflecting the electron beam by means of at least one additional deflection system out of said optical axis with a strength dependent upon the particular magnification; and,
   shaping the cross section of the electron beam by means of said diaphragms more or less in dependence upon the strength of the deflection.

6. The method of claim 4, wherein said ancillary deflection system comprises a double deflection system disposed downstream of the last one of said plurality of condenser lenses; and, said double deflection system defining a pivot point lying in the front focal point of said SFCO lens.

7. The method of claim 4, wherein said ancillary deflection system comprises a double deflection system disposed upstream of the last one of said plurality of condenser lenses; and, said double deflection system defining a pivot point lying in the approximately constant principal plane of said last condenser lens.

8. The method of claim 4, wherein the last one of said condenser lenses is excited to deflect the electron beam toward the optical axis after the electron beam is deflected out of said optical axis by the deflection system.

9. The method of claim 8, wherein said electron beam limited by said one diaphragm is displaced parallel to said optical axis conjointly by said ancillary deflection system and said last one of said condenser lenses.

10. The method of claim 8, wherein said ancillary deflection system is mounted in the last crossover plane of the zoom of the condenser lenses; and, said one diaphragm is mounted ahead of said crossover plane.

11. The method of claim 8, wherein said ancillary deflection system is a double deflection system which is mounted below the crossover of the zoom of the condenser lenses so as to cause its virtual pivot point to lie in said crossover.

12. The method of claim 5, wherein said additional deflection system is mounted after the last one of said condenser lenses; and wherein said first diaphragm is disposed upstream of said additional deflection system and said second diaphragm is disposed upstream of both said first-mentioned deflection system and said SFCO lens.

13. The method of claim 5, wherein said additional deflection system is a double deflection system which is mounted downstream of the last one of the condenser lenses; and, wherein said first diaphragm is disposed upstream of said double deflection system and said second diaphragm is disposed downstream of said double deflection system.

14. The method of claim 5, said additional deflection system being a double deflection system which is mounted downstream of the last one of the condenser lenses; and, wherein said diaphragms are mounted within said double deflection system.

15. The method of claim 5, wherein the first-mentioned deflection system disposed upstream of said SFCO lens and/or said additional deflection system are used for correcting lateral displacements of the diaphragms.

* * * * *

UNITED STATES PATENT AND TRADEMARK OFFICE
CERTIFICATE OF CORRECTION

PATENT NO. : 5,013,913

DATED : May 7, 1991

INVENTOR(S) : Gerd Benner

It is certified that error appears in the above-identified patent and that said Letters Patent is hereby corrected as shown below:

On the title page, in the References Cited: delete "4,633,085  12/1986  Tomita et al..................250/11" and substitute therefor
-- 4,633,085  12/1986  Tomita et al............250/311 --.

In column 6, line 30: between "apply to" and "deflection system", insert -- the use of the smallest diaphragm. The pivot point of the --

In column 6, line 58: delete "flecting system" and substitute -- flection system -- therefor.

In column 7, line 43: delete "XX." and substitute -- X. -- therefor.

Signed and Sealed this

Sixth Day of April, 1993

*Attest:*

STEPHEN G. KUNIN

*Attesting Officer*    Acting Commissioner of Patents and Trademarks